(12) United States Patent
Yoshida et al.

(10) Patent No.: US 6,274,964 B1
(45) Date of Patent: Aug. 14, 2001

(54) PIEZOELECTRIC RESONATOR

(75) Inventors: Ryuhei Yoshida, Toyama; Masaya Wajima, Shinminato; Kenichi Sakai, Toyama, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/190,638

(22) Filed: Nov. 12, 1998

(30) Foreign Application Priority Data

Dec. 16, 1997 (JP) ................................. 9-346799

(51) Int. Cl.$^7$ ................................................. H01L 41/08
(52) U.S. Cl. ......................... 310/321; 310/366; 310/326
(58) Field of Search ............................. 310/321, 366, 310/326, 327, 348, 349

(56) References Cited

U.S. PATENT DOCUMENTS

| | | | |
|---|---|---|---|
| 4,918,350 | * | 4/1990 | Ando et al. ......................... 310/320 |
| 4,992,693 | * | 2/1991 | Kishi et al. ......................... 310/348 |
| 5,444,326 | * | 8/1995 | Yoshida et al. ..................... 310/359 |
| 5,541,469 | * | 7/1996 | Kaida ................................. 310/367 |
| 5,701,048 | * | 12/1997 | Kaida ................................. 310/321 |
| 5,925,968 | * | 7/1999 | Yachi et al. ......................... 310/320 |

FOREIGN PATENT DOCUMENTS

| | | | |
|---|---|---|---|
| 4-216208 | 8/1992 | (JP) | ............................. H03H/9/125 |
| 9-139651 | 5/1997 | (JP) | ............................. H03H/9/19 |
| 9-181556 | 7/1997 | (JP) | ............................. H03H/9/17 |

* cited by examiner

*Primary Examiner*—Thomas M. Dougherty
(74) *Attorney, Agent, or Firm*—Keating & Bennett, LL

(57) ABSTRACT

A piezoelectric resonator adapted to generate a third harmonic wave of a thickness extensional vibration mode in which the fundamental wave is lead out of the vibrating portion and suppressed effectively. The piezoelectric resonator includes a vibrating portion with vibration electrodes opposing each other in the middle of a piezoelectric plate, lead-out electrodes electrically connected to the vibration electrodes, and a floating electrode disposed along the short side edge on at least one major surface of the piezoelectric plate or in the vicinity of the edge.

20 Claims, 10 Drawing Sheets

US 6,274,964 B1

PIEZOELECTRIC RESONATOR

BACKGROUND OF THE INVENTION

1. Field of the Invention

The present invention relates to a piezoelectric resonator adapted to generate a third harmonic wave of a thickness extensional vibration mode, and more particularly, relates to a piezoelectric resonator in which the use of a floating electrode makes it possible to suppress the fundamental harmonic wave.

2. Description of the Related Art

In piezoelectric resonators adapted to vibrate in a thickness extensional vibration mode, a variety of piezoelectric resonators utilizing harmonics thereof have been proposed in order to cope with piezoelectric resonators of higher frequencies.

For example, in Japanese Unexamined Patent Publication No. 9-181556, a piezoelectric transducer adapted to generate a third harmonic wave of a thickness extensional vibration mode is disclosed. FIG. 11 is a top plan view of the piezoelectric transducer described in JP 9-181556. In the piezoelectric transducer 51, a vibration electrode 53 extending to the center from the end portion 52a of a piezoelectric substrate 52 is disposed on a first major surface of the strip-shaped piezoelectric substrate 52. On a second major surface of the piezoelectric substrate 52, a vibration electrode 54 extending to the center from the end portion 52b is disposed. The vibration electrodes 53 and 54 are arranged in the middle area of the piezoelectric substrate so as to oppose each other via the piezoelectric substrate 52. The portion where the vibration electrodes 53 and 54 oppose each other constitutes a vibrating portion and the application of an alternating voltage between the vibration electrodes 53 and 54 causes the vibrating portion to vibrate in a thickness extensional vibration mode.

Because the third harmonic wave of a thickness extensional vibration mode is utilized, it is necessary to suppress the fundamental wave as an unwanted spurious component. So, damping layers 55 and 56 are disposed on the first major surface of the piezoelectric substrate 52. Then, the damping layers 55 and 56 are disposed between the above-mentioned vibrating portion and the end portion 52a and between the vibrating portion and the end portion 52b, respectively.

Also, a pair of damping layers with the vibrating portion arranged between them are disposed on the second major surface of the piezoelectric substrate 52. Each of the damping layers on the second major surface is arranged to face the damping layers 55 and 56 disposed on the first major surface, respectively.

The damping layers 55 and 56, and the damping layers disposed on the second major surface are made up of, for example, thermosetting epoxy resins, phenolic resins, solder, and others. It is claimed in JP 9-181556 that in the piezoelectric transducer 51, the vibration of a third harmonic wave can be distributed in the area between the damping layer 55 and the damping layer 56, and the fundamental wave can be effectively suppressed at the damping layers 55 and 56, and others.

On the other hand, in Japanese Unexamined Patent Publication No. 4-216208, a piezoelectric resonator adapted to generate a third harmonic wave of a thickness extensional vibration mode in which the use of a floating electrode makes it possible to suppress spurious components caused by the fundamental wave is disclosed. The piezoelectric resonator described in JP 4-216208 is shown in FIG. 12. In the piezoelectric resonator 61, a vibration electrode 63 is disposed in the middle of the first major surface of a rectangular piezoelectric substrate 62 and a vibration electrode 64 is located in the middle of the second major surface. The vibration electrodes 63 and 64 oppose each other via the piezoelectric substrate 62 located therebetween.

In addition, the vibration electrode 63 is connected to the lead-out electrode 65 disposed along the edge on the short side of the piezoelectric substrate 62, and the vibration electrode 64 is electrically connected to the lead-out electrode 66 disposed along the edge of the short side on the second major surface of the piezoelectric substrate 62.

On the other hand, a pair of floating electrodes 67a and 67b are disposed along the long-side edges on the first major surface of the piezoelectric substrate 62. Also, on the second major surface of the piezoelectric substrate 62, floating electrodes 67c and 67d are disposed so as to oppose the floating electrodes 67a and 67b via the piezoelectric substrate 62 disposed therebetween.

In the piezoelectric resonator 61, the portion where the vibration electrodes 63 and 64 oppose each other constitutes a vibrating portion, and a third harmonic wave of a thickness extensional vibration mode is trapped in the vibrating portion. Also, the fundamental wave is propagated outwardly from the vibrating portion located in the center, but because of the mechanical load of the floating electrodes 67a through 67d and the piezoelectric short-circuit effect, the vibration energy of the fundamental wave is absorbed by the portions in which the floating electrodes 67a through 67d are disposed, and accordingly, the suppression of unwanted spurious components caused by the fundamental wave is supposedly achieved.

Further, in Japanese Unexamined Patent Publication No. 9-139651, a harmonic quartz oscillator provided to suppress the fundamental wave by using floating electrodes is disclosed. The quartz oscillator of JP 9-139651 is explained with reference to FIG. 13.

The quartz oscillator 71 is composed of a rectangular quartz crystal 72. An excitation electrode 73 is disposed in the middle of the first major surface of the quartz crystal 72. Another excitation electrode is disposed in the middle of the second major surface of the quartz crystal 72. The excitation electrode disposed on the second major surface is arranged to oppose the excitation electrode 73 disposed on the first major surface. The excitation electrode 73 is connected to the lead-out electrode 74 disposed around the end portion 72a on the short side of the quartz crystal 72. The lead-out electrode 74 is disposed around the end portion 72a so as to extend over the end surface and the first and second major surfaces.

Also, the other excitation electrode disposed in the middle of the second major surface of the quartz crystal 72 is electrically connected to the lead-out electrode 75 disposed at the other end portion 72b of the quartz crystal 72. The lead-out electrode 75 is disposed at the end portion 72b so as to extend over the end surface and the first and second major surfaces.

Accordingly, the application of an alternate voltage to the lead-out electrodes 74 and 75 produces harmonic waves of a thickness extension mode. In addition, fundamental wave suppressing electrodes 76 and 77 are disposed along the edge of the long sides of the quartz crystal 72. The fundamental wave suppressing electrodes 76 and 77 are disposed along the edge of the long sides on the first and second major surfaces of the quartz crystal 72.

That is, the mechanical damping of only the fundamental wave leaked out of the vibrating portion by the fundamental wave suppressing electrodes 76 and 77 suppresses the fundamental wave.

However, in the above-mentioned piezoelectric resonator making use of a harmonic wave of a thickness extension mode, spurious components caused by the fundamental wave are suppressed only to a certain level, but the fundamental wave can not be fully suppressed.

SUMMARY OF THE INVENTION

In order to solve the problems described above, preferred embodiments of the present invention provide a piezoelectric resonator adapted to generate a third harmonic wave of a thickness extensional vibration mode and effectively suppress a fundamental wave as a spurious component.

A preferred embodiment of the present invention provides a piezoelectric resonator adapted to generate a third harmonic wave of a thickness extensional vibration mode including a piezoelectric plate; first and second vibration electrodes partially disposed on a first major surface and a second major surface of the piezoelectric plate, respectively and arranged so as to oppose each other via the piezoelectric plate; first and second lead-out electrodes electrically connected to the first and the second vibration electrodes, respectively; and a floating electrode disposed along or in the vicinity of an edge on a short side of the piezoelectric plate on at least one of the first major surface and the second major surface of the piezoelectric plate.

According to the above-described piezoelectric resonator, because a floating electrode is disposed on at least one major surface of a piezoelectric plate along the edge on the short side of the piezoelectric plate or along the vicinity of the edge, the fundamental wave easily leaks from the vibrating portion to the electrode, and the fundamental wave is able to be damped by the load of mass on the floating load. Moreover, because the floating electrode is disposed along the edge on the short side of the piezoelectric plate or along the vicinity of the edge, the area of the floating electrode can be made larger without using larger-sized piezoelectric plates, and consequently, the fundamental wave is more effectively damped or suppressed.

Therefore, unwanted spurious components produced by the fundamental wave can be effectively suppressed, and it is possible to provide a small-sized piezoelectric resonator in which a stable third harmonic wave of a thickness extensional vibration mode can be produced.

In the above described piezoelectric resonator, a damping layer made of resin may be provided on the floating electrode.

According to the above structure, the fundamental wave can be more effectively suppressed by the load of mass of the damping layer.

Also, a casing substrate may be laminated on at least one of the first major surface and the second major surface of the piezoelectric plate via an insulating adhesive so as not to prevent or hinder vibration of the vibrating portion including the first and the second vibration electrodes.

According to the above structure, because a casing substrate is laminated on at least one major surface of the piezoelectric plate so as not to hinder the vibration of the vibrating portion having the first and second vibration electrodes, the casing substrate is laminated via an insulating adhesive, and consequently, the fundamental wave leaked around the vibrating portion is suppressed even more.

In a preferred embodiment of the piezoelectric resonator, a ratio of G/d is preferably about 0.42 or less where G is a distance between the first vibration electrode and the floating electrode or a distance between the second vibration electrode and the floating electrode, and d is a diameter of the first vibration electrode or the second vibration electrodes.

According to the above-described piezoelectric resonator, the fundamental wave leaked out can be more effectively suppressed as made clear in the above-mentioned example of preferred embodiments of the present invention.

In the above described piezoelectric resonator, preferably the ratio of W/d about 0.5 or more is satisfied where W is a length of the floating electrode along the short side of the piezoelectric plate, and d is a diameter of the first vibration electrode or the second vibration electrodes.

Similarly, according to the above piezoelectric resonator, the fundamental wave is effectively suppressed even more as clearly seen in the above-mentioned example of preferred embodiments of the present invention.

Other features and advantages of the present invention will become apparent from the following description of the invention which refers to the accompanying drawings.

DETAILED DESCRIPTION OF PREFERRED EMBODIMENTS

Figure 1:
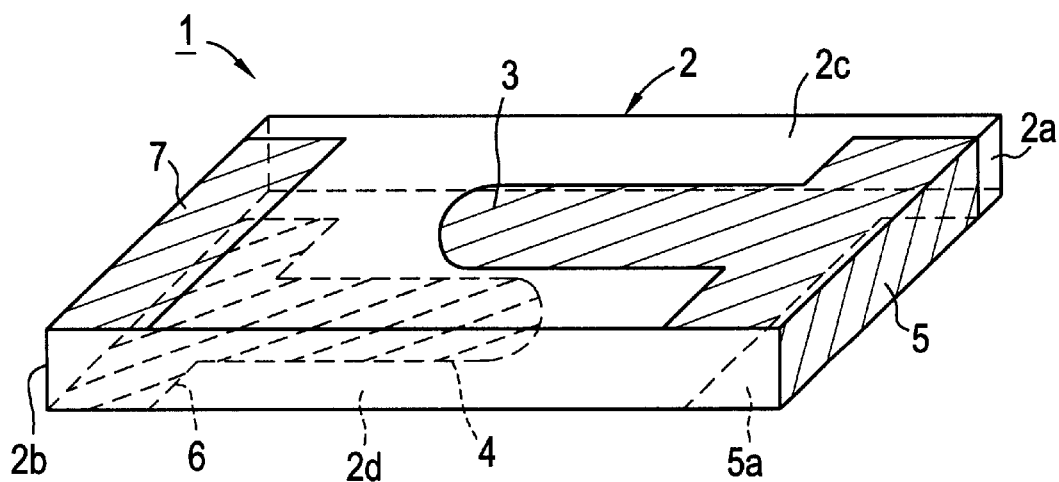
FIG. 1 is a perspective view showing a piezoelectric resonator according to a first preferred embodiment of the present invention.

FIG. 1 is a perspective view showing a piezoelectric resonator relating to the first preferred embodiment of the present invention.

The piezoelectric resonator 1 is preferably an energy-trap type which is adapted to generate a third harmonic wave of a thickness extensional vibration mode. In the piezoelectric resonator 1, a substantially rectangular piezoelectric plate 2 is preferably used. The piezoelectric plate 2 is composed of, for example, piezoelectric ceramics such as lead titanate zirconate or piezoelectric single crystals such as quartz, $LiNbO_3$, and others. When the piezoelectric plate 2 is composed of one of the piezoelectric ceramics, it is treated so as to be polarized in the thickness direction.

The first vibration electrode 3 is disposed in the middle of the first major surface of the piezoelectric plate 2. The second vibration electrode 4 is disposed on the second major surface of the piezoelectric plate 2 so as to face the vibration electrode 3 with the piezoelectric plate 2 disposed therebetween.

A vibrating portion is composed of the portion in which the vibration electrodes 3 and 4 oppose each other through the piezoelectric plate 2.

In the first preferred embodiment, the vibration electrode 3 is extended from the above-mentioned vibrating portion toward the end surface 2a on the short side of the piezoelectric plate 2. Also, the vibration electrode 4 is extended toward the other end surface 2b at the short side on the second major surface of the piezoelectric plate 2.

However, the vibration electrodes 3 and 4 are arranged to constitute the above-mentioned vibrating portion. Accordingly, as for the extension portion to the end surface 2a or the end surface 2b, extending from the vibrating portion, it is not restricted to the illustrated shape and the width may be narrower than that at the vibrating portion.

On the end surface 2a, a lead-out electrode 5 is provided. The lead-out electrode 5 is provided so as to extend not only over the end surface 2a, but over the first major surface 2c and the second major surface 2d, and so as to be electrically connected to the extension portion of the above-mentioned vibration electrode 3 on the first major surface 2c.

Also, on the second major surface 2d of the piezoelectric plate 2, a lead-out electrode 6 is provided along the edge of the short side in the vicinity of the end surface 2b. The above-mentioned extension portion of the vibration electrode 4 is electrically connected to the lead-out electrode 6.

Therefore, the vibration electrode 5 has the portion 5a extending over the second major surface 2d of the piezoelectric plate 2 and the vibration electrode 6 is disposed on the second major surface 2d of the piezoelectric plate. Accordingly, the piezoelectric resonator 1 can be installed on the surface of a casing substrate, and others as shown in FIG. 1.

On the other hand, on the side of the end surface 2b, a floating electrode 7 is disposed along the edge of the short side on the first major surface 2c of the piezoelectric plate 2. Further, the floating electrode 7 does not need to be in contact with the end surface, and may be arranged at a position slightly spaced from the end surface or in the vicinity of the end surface.

In the piezoelectric resonator 1, the application of an alternating voltage to the lead-out electrodes 5 and 6 brings about a thickness extension vibration at the vibrating portion in which the vibration electrodes oppose each other, and the suppression of the fundamental wave by the above floating electrode 7 is devised in order to utilize the third harmonic wave.

In the piezoelectric resonator adapted to generate a third harmonic wave of a thickness extensional vibration mode, it is required that it be easy for the fundamental wave to leak out of the vibrating portion and to effectively damp the leaked fundamental wave in order to achieve an effective damping of the fundamental wave. In the piezoelectric resonator 1 of the first preferred embodiment, the above-mentioned floating electrode 7 located outside of the vibrating portion makes it easy for the fundamental wave to leak out of the vibrating portion.

Figure 11:
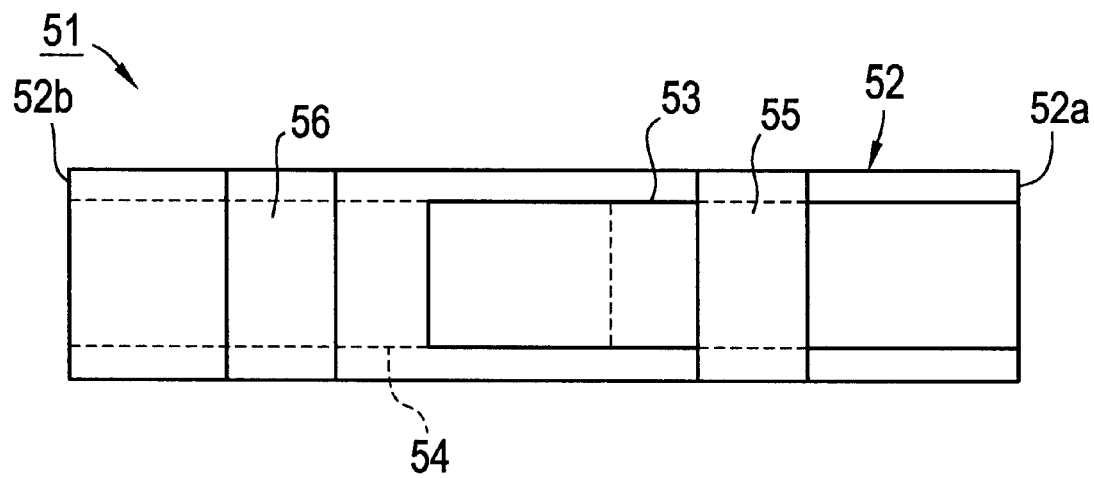
FIG. 11 is a top plan view to explain a conventional piezoelectric transducer.

That is, if the floating electrode 7 is not provided, for example, in the construction of an extended part extending from part of a pair of the vibration electrodes like the conventional piezoelectric transducer 51 shown in FIG. 11, although a pair of vibration electrodes do not oppose each other in the thickness direction, the driving electric field more or less extending to the existing electrodes causes electrical excitation of the fundamental wave and makes the response of the fundamental wave larger. As a result, the fundamental wave can not be lead out of the vibrating portion.

On the contrary, in this preferred embodiment, the above-mentioned floating electrode 7 disposed outside of the vibrating portion makes it easier for the fundamental wave to leak out of the vibrating portion.

Figure 12:
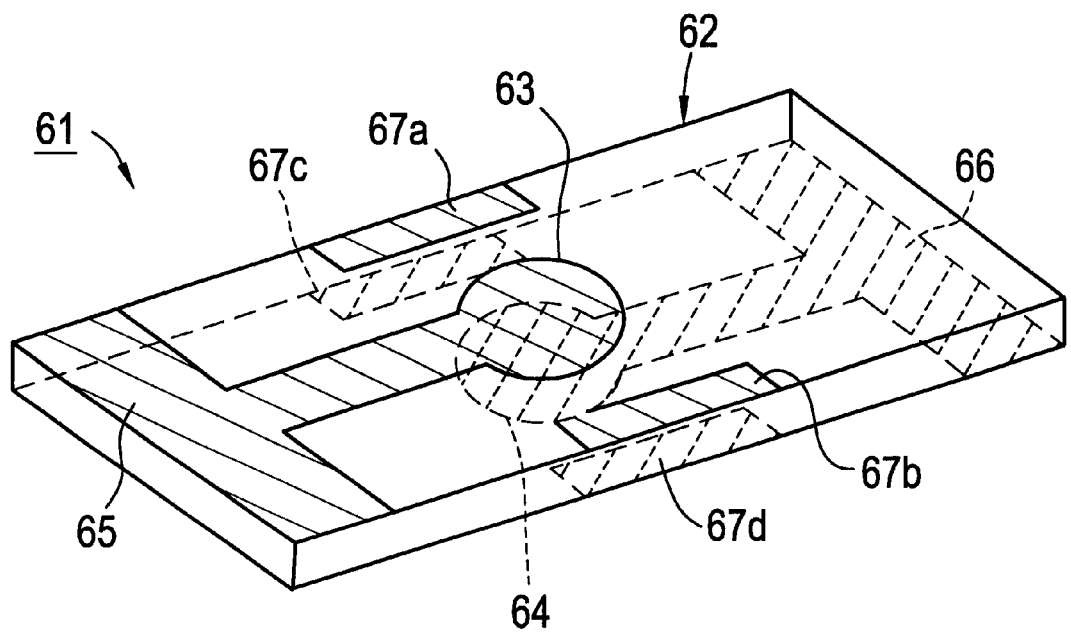
FIG. 12 is a perspective view to show another example of a piezoelectric resonator.
Figure 13:
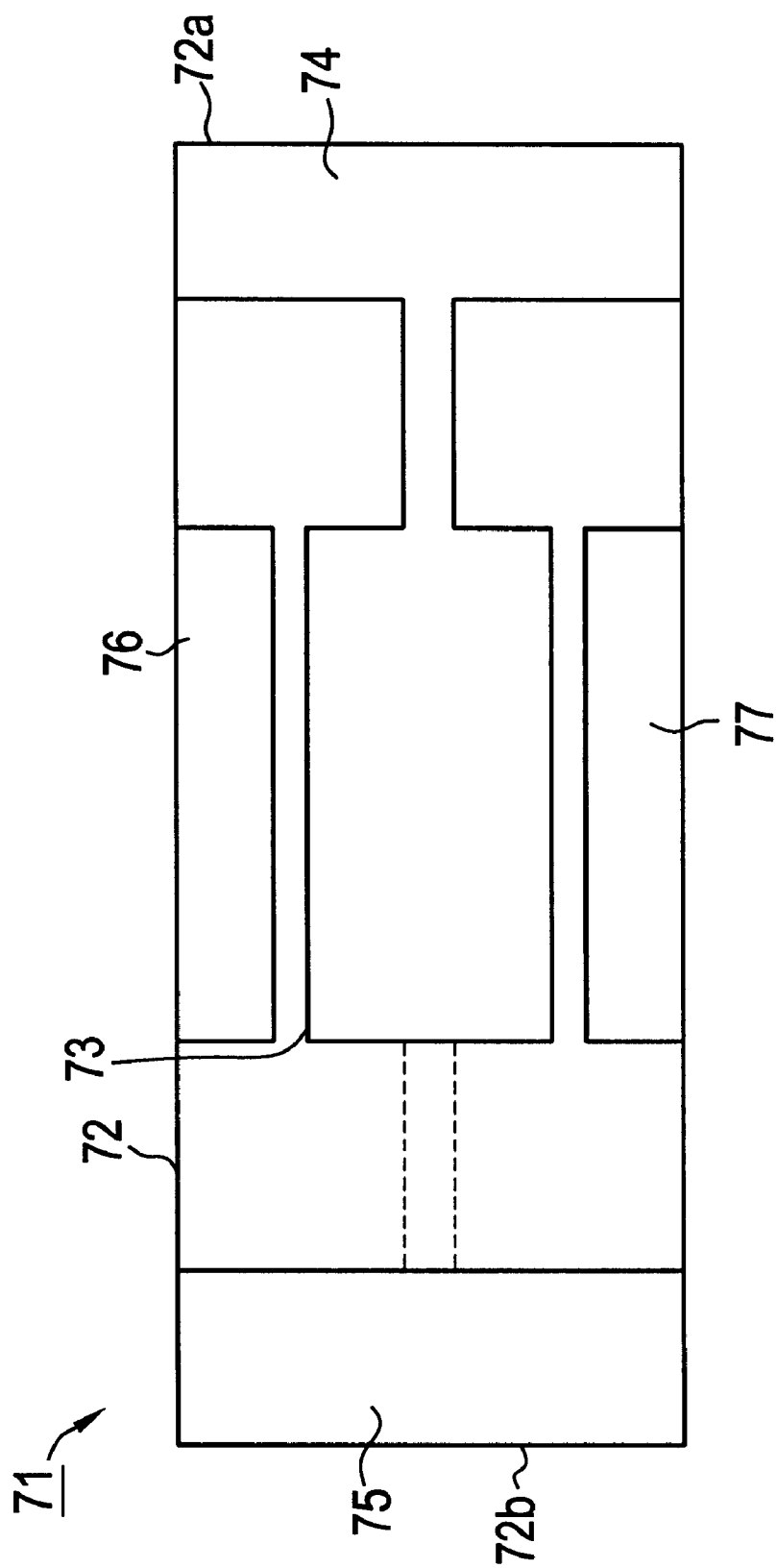
FIG. 13 is a top view to show another example of a conventional piezoelectric resonator.

Moreover, the larger the area of the floating electrode 7, the more effectively the fundamental wave is able to be lead out of the vibrating portion. In this preferred embodiment, the floating electrode 7 is disposed along the edge on the short side of the piezoelectric plate 2. Therefore, compared with the piezoelectric resonators 61 and 71 having the floating electrodes disposed on the long side, both of which are shown in FIG. 12 and FIG. 13, respectively, the area of the floating electrodes can be made larger. That is, in the piezoelectric resonators 61 and 71, the floating electrodes are disposed along the edge of the long sides, and accordingly, it is difficult to form floating electrodes having a larger area along the long sides when the vibrating portion is required to have a sufficiently large area.

On the contrary, in the piezoelectric resonator 1, the floating electrode 7 is disposed along the edge on the short side, and accordingly, the length of the floating electrode along the long side of the piezoelectric plate 2 can be lengthened sufficiently as required, which makes the fundamental wave effectively leak out of the vibrating portion.

In addition, because the floating electrode 7 is disposed along the edge on the short side of the piezoelectric plate 2, the main vibration does not leak and reach the portion in which the floating electrode 7 is provided.

Therefore, because of the load of mass due to the floating electrode 7, damping is effectively performed on only the fundamental wave that is leaked out, and as for the third harmonic wave, a sufficient response is made available.

Therefore, because the above electrode 7 is able to suppress the fundamental wave leaked out by means of the load of the mass, the floating electrode 7 is able to be composed of the same materials as electrode materials constituting the vibration electrodes 3 and 4, for example, metals such as Ag, Cu, Ag—Pd, and other materials although the materials are not restricted. Accordingly, the floating electrode is effectively disposed on the piezoelectric plate 2 in the same process as that for the vibration electrodes. Also, the floating electrode 7 may be made up of metal materials having larger mass such as solder in order to increase the function of the load of mass.

Further, a damping layer composed of resins which are preferably soft compared with metals may be preferably provided on the floating electrode 7. Resins constituting such a damping layer are not especially restricted, but the use of epoxy group adhesives, silicone group adhesives, and others is desirable because the damping layer is easier to form.

In the piezoelectric resonator 1, the floating electrode 7 was disposed on the first major surface 2c of the piezoelectric plate 2, but the floating electrode in the piezoelectric resonator relating to preferred embodiments of the present invention can be variously modified and is not limited to the configuration shown in FIG. 1.

Figure 2:
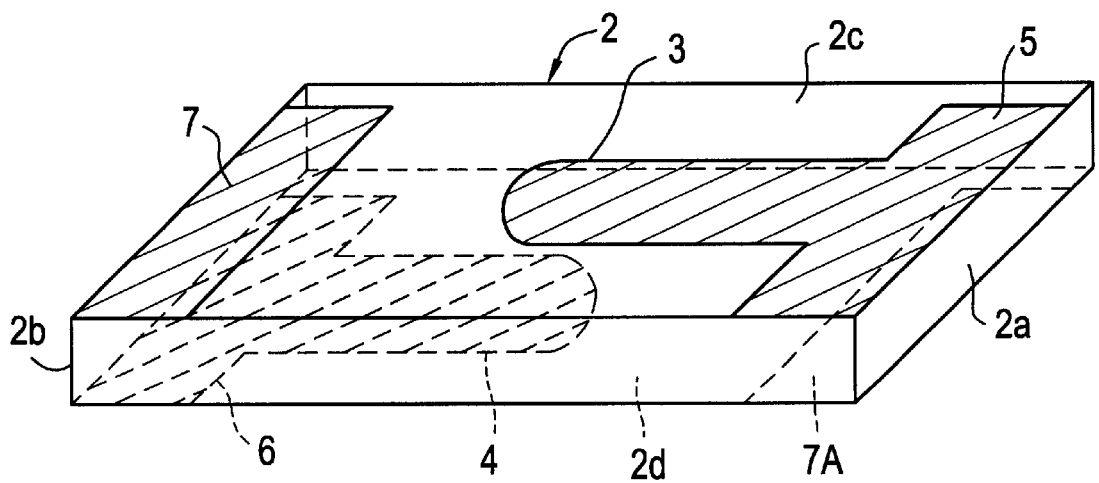
FIG. 2 is a perspective view showing a modified piezoelectric resonator of the first preferred embodiment shown in FIG. 1.

For example, as shown in FIG. 2, a floating electrode 7A may be provided on the second major surface 2d of the piezoelectric plate 2. In this case, the floating electrode 7A is disposed on the second major surface of the piezoelectric plate 2 along the edge of the end surface 2a and the second major surface 2d. Accordingly, as for the lead-out electrode 5, it is provided only on the first major surface 2c of the piezoelectric plate 2 so as not to extend over the end surface 2a and the second major surface 2d.

Figure 3:
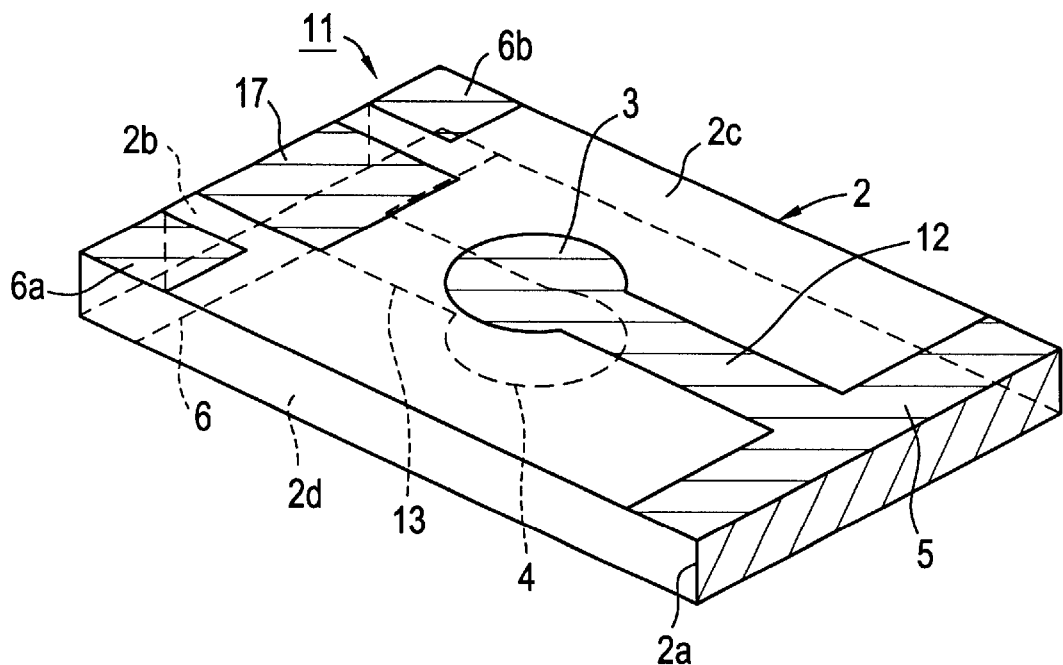
FIG. 3 is a perspective view of a piezoelectric resonator according to a second preferred embodiment of the present invention.

FIG. 3 is a perspective view of a piezoelectric resonator relating to the second preferred embodiment of the present invention.

In the piezoelectric resonator 11, a floating electrode 17 is disposed on the first major surface 2c of the piezoelectric plate 2 nearly in the center of the edge on the short side. That is, the floating electrode 17 is disposed so as not to extend to the edge of the long side. A substantially circular vibration electrode 3 is disposed in the middle of the first major surface 2c of the piezoelectric plate 2. On the second major surface 2d, a substantially circular vibrating electrode 4 is disposed opposite to the vibration electrode 3.

The vibration electrode 3 is connected to a lead-out electrode 5 via a connecting conductive portion 12. The lead-out electrode 5 is arranged so as to cover one end surface 2a of the piezoelectric plate 2 and extend over the first major surface 2c and the second major surface 2d.

On the other hand, on the second major surface 2d of the piezoelectric plate 2, the vibration electrode 4 is electrically connected to the lead-out electrode 6 via a connecting conducting portion 13. The lead-out electrode 6 is provided on the second major surface 2d of the piezoelectric plate 2 along the edge on the short side. In addition, a part of the lead-out electrode 6 is arranged so as to extend over the end surface 2b and the first major surface 2c of the piezoelectric plate 2. In fact, the lead-out electrode extension portion 6a and 6b arranged to extend over the end surface 2b and the first major surface 2c is disposed so as not to be electrically connected to the floating electrode 17.

In this preferred embodiment, the lead-out electrode 6 has the electrode extension portions 6a and 6b extending over the first major surface 2c. Accordingly, the piezoelectric plate 2 can be installed on a casing substrate on its first major surface 2c.

In the second preferred embodiment, also, because the floating electrode 17 is disposed along the edge on the short side of the piezoelectric plate 2, the dimension of the floating electrode 17 can be made larger along the long side of the piezoelectric plate 2. Consequently, leaking of the fundamental wave is able to increase in the same way as the piezoelectric resonator 1 and the fundamental wave leaked out is able to be effectively suppressed by the load of mass of the floating electrode 17.

Figure 4:
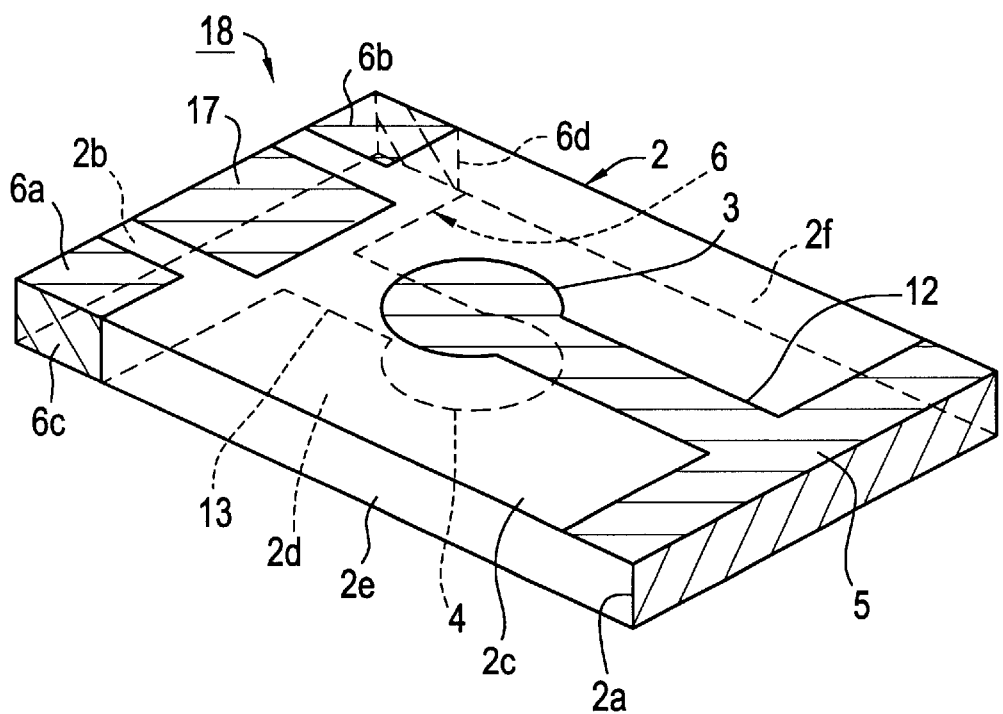
FIG. 4 is a perspective view illustrating a modification of the piezoelectric resonator of the second preferred embodiment of the present invention.

FIG. 4 is a perspective view of a modified piezoelectric resonator 11. In this piezoelectric resonator 18, a lead-out electrode 6 provided on the second major surface of the piezoelectric plate 2 is connected to an electrode extension portion 6a and 6b via an electrode extension portion 6c and 6d disposed on the side surfaces 2e and 2f of the piezoelectric plate 2, respectively.

As to other points, the piezoelectric resonator is constructed in the same way as the piezoelectric resonator 11. Consequently, it is possible to suppress the fundamental wave via the floating electrode 17.

Figure 5:
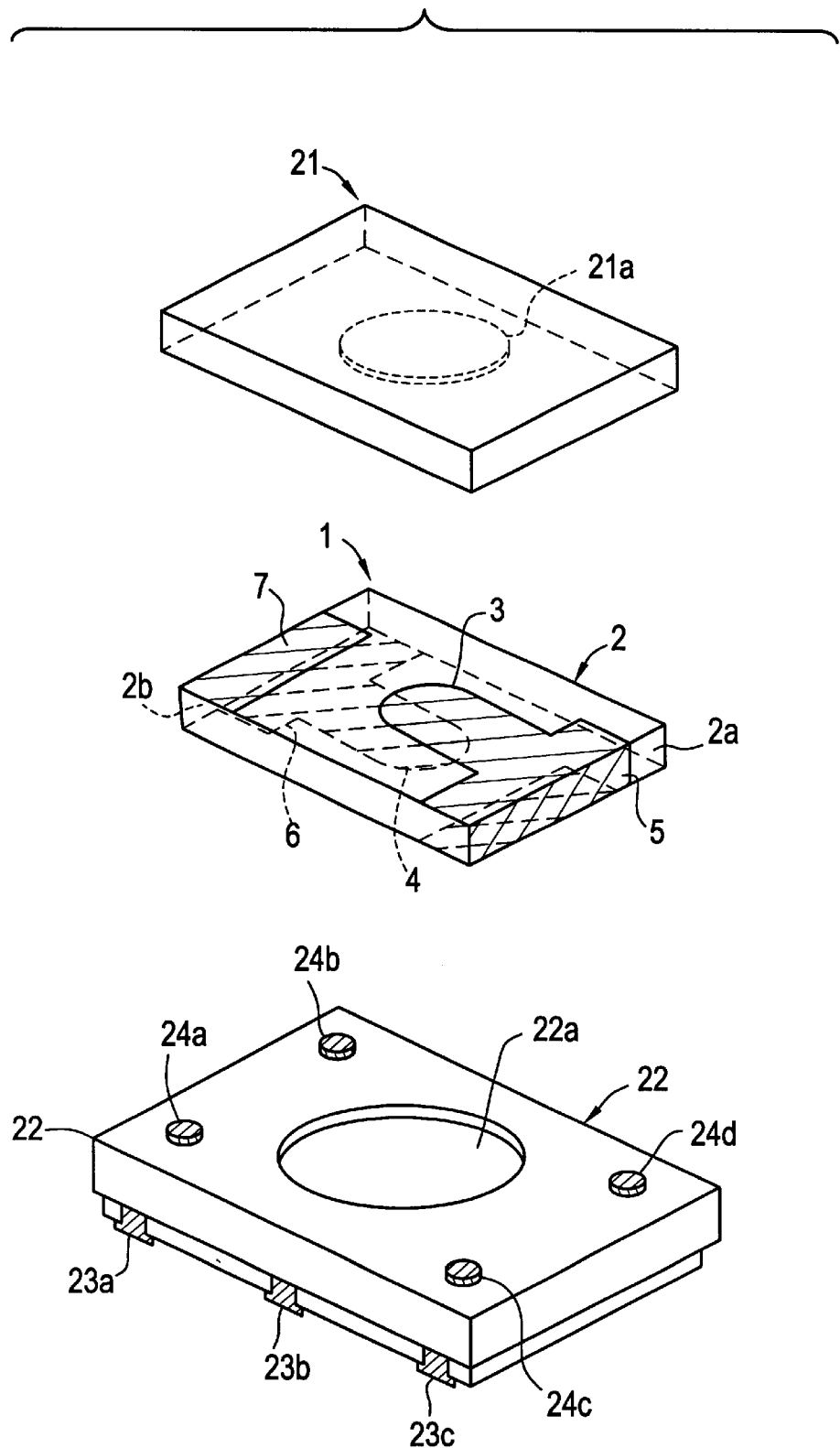
FIG. 5 is an exploded perspective view illustrating a piezoelectric resonator relating to a third preferred embodiment of the present invention, that is, of a chip-type piezoelectric resonator component.

FIG. 5 is an exploded perspective view to explain a piezoelectric resonator relating to the third preferred embodiment of the present invention.

A piezoelectric resonator of the third preferred embodiment is a chip-type piezoelectric resonator component which is composed of the piezoelectric resonator 1 of the preferred embodiment shown in FIG. 1.

That is, casing substrates 21 and 22 shown in FIG. 5 are laminated on the first and second major surfaces of the piezoelectric resonator 1, which is made of a chip-type piezoelectric resonator component to be mounted. The casing substrate 21 is made up of insulating ceramics such as alumina or insulating materials such as appropriate synthetic resins. The casing substrate is a substantially rectangular plate and has a recess portion 21a on its second major surface. The recess portion 21a is provided so as to prepare an opening which allows for free and unhindered vibration of the vibrating portion made up of vibration electrodes 3 and 4.

The casing substrate 22 is composed of appropriate insulating materials in the same way as the casing substrate 21.

The casing substrate 22 is, also, a nearly rectangular plate. On the first major surface of the casing substrate 22, a recess portion 22a is provided. The recess portion 22a is provided so as to prepare an opening which allows for free vibration of the vibrating portion of the piezoelectric resonator 1 as the recess portion 21a.

Terminal electrodes 23a through 23c are arranged so as to extend from the second major surface to a portion of the side surface of the casing substrate 22. The terminal electrodes 23a through 23c are provided in order that the chip-type piezoelectric resonator of the preferred embodiment is electrically connected to the electrode lands on a printed-circuit board when installed on the printed-circuit board.

The terminal electrodes 23a and 23c are connected to the conductive adhesives 24a and 24b or 24c and 24d provided on the first major surface of the casing substrate 22 via conductive paths made up of through-holes disposed inside the casing substrate 22 and others. Further, instead of the conductive adhesives, conductive binders such as solder may be used.

When casing substrates 21 and 22 are joined to the first and second major surfaces of the piezoelectric resonator 1, insulating adhesive is coated on the first and second major surfaces of the piezoelectric resonator 1. The coating of the insulating adhesive is explained in reference to FIG. 6.

Figure 6:
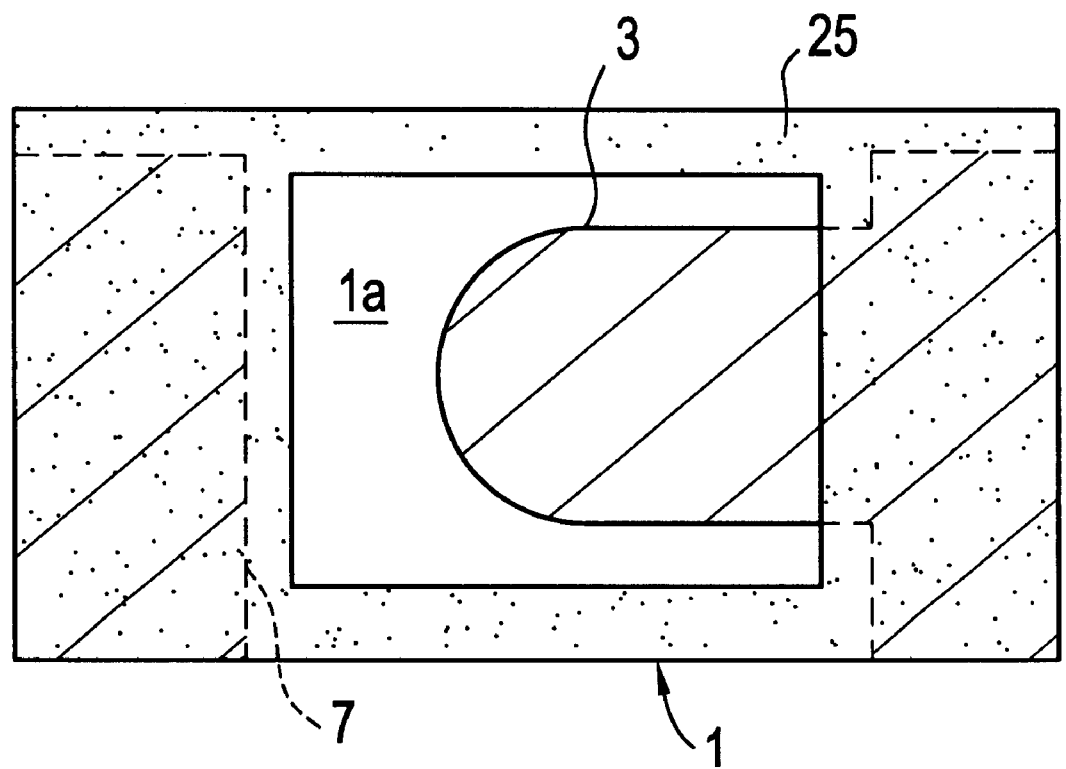
FIG. 6 is a top plan view showing an insulating adhesive layer provided on the first major surface of the piezoelectric resonator in the preferred component embodiment shown in FIG. 5.

As shown in FIG. 6, the insulating adhesive 25 is coated, except at the vibrating portion and its surrounding area, on the middle first major surface of the piezoelectric resonator 1. In FIG. 6, the area 1a in which the insulating adhesive is not coated has a substantially rectangular shape, but the shape of the area is not limited to a substantially rectangular shape, and may be other shapes.

On the second major surface of the piezoelectric resonator 1, an insulating adhesive is applied in a similar manner.

After that, the casing substrates 21 and 22 shown in FIG. 5 are laminated on the first and second major surfaces of the piezoelectric resonator 1. In this case, on the side of the second major surface of the piezoelectric resonator 1, the insulating adhesive is pressed and moved back by the conductive adhesives 24a through 24d, and the conductive adhesives 24a and 24b are connected to the lead-out electrode 6 and the conductive adhesives 24c and 24d to the lead-out electrode 5. Thus, the lead-out electrodes and the conductive adhesives are electrically connected to each other.

Also, the casing substrates 25 and 26 are joined to the piezoelectric resonator 1, and the vibrating portion is enclosed by the insulating adhesive 25 coated on the first and second major surfaces of the piezoelectric resonator 1.

Similarly, the floating electrode 7 is also enclosed by the above-mentioned insulating adhesive 25.

Consequently, a short circuit of the floating electrode 7 to the vibrating electrodes 3 and 4, and other defects are effectively prevented.

In addition, because the above-mentioned insulating adhesive 25 is provided on the floating electrode 7, the adhesive 25 is able to function as a damping layer. Accordingly, the leaked vibration of the fundamental wave can be further suppressed via the above-mentioned insulating adhesive 25.

Also, without the above-mentioned floating electrode 7, it is possible to suppress the leaked fundamental wave, but in the preferred embodiment, the above-mentioned floating electrode 7 is provided and the floating electrode 7 damps the fundamental wave. Therefore, the fundamental wave is more effectively suppressed at the position located further away from the vibrating portion.

Figure 7:
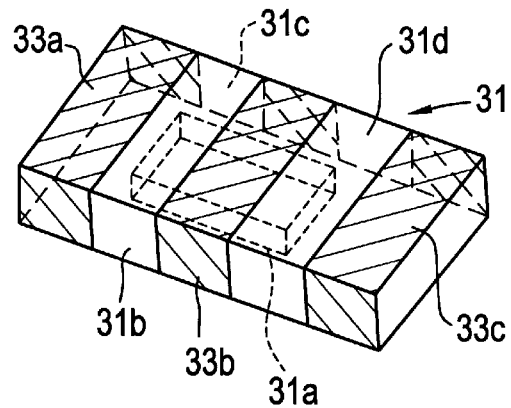
FIG. 7 is an exploded perspective view showing a chip-type piezoelectric resonator component relating to a fourth preferred embodiment of the present invention.
Figure 7:
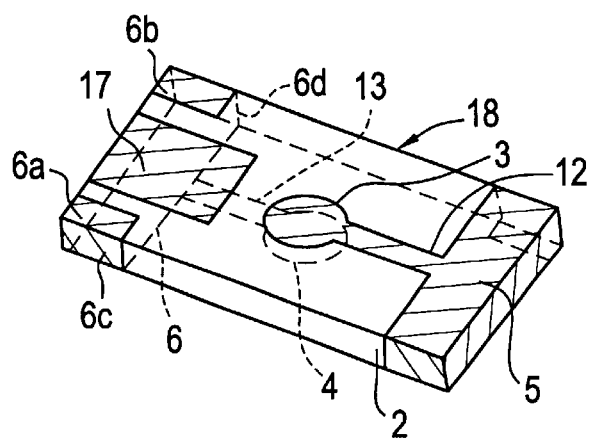
Figure 7:
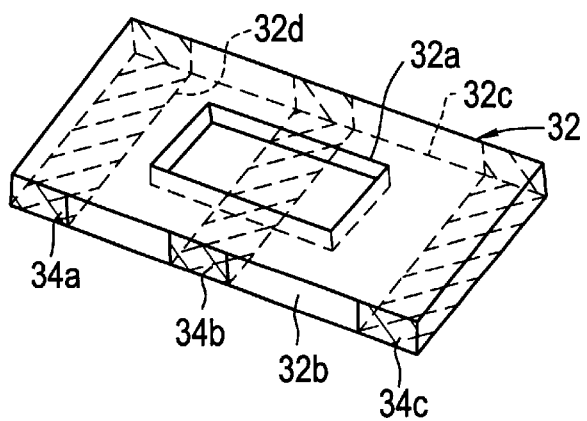

FIG. 7 is an exploded perspective view to explain a chip-like piezoelectric resonator component according to the fourth preferred embodiment of the present invention.

In this preferred embodiment, casing substrates 31 and 32 are laminated on the first and second major surfaces of the piezoelectric resonator shown in FIG. 4.

Also, the casing substrates 31 and 32 are composed of appropriate insulating materials as the above-mentioned casing substrate 21 is, and a recess portion 31a and a substantially rectangular recess portion 32a are provided on the second major surface of the casing substrate 31 and on the first major surface of the casing substrate 31, respectively.

Also, terminal electrodes 33a through 33c are disposed so as to extend over the side surfaces 31b and 31c and the first major surface 31d of the casing substrate 31. Terminal electrodes 34a through 34c are disposed so as to extend over the side surfaces 32b and 32c and the second major surface 32c of the casing substrate 32. These terminal electrodes 33a through 33c and 34a through 34c are provided by evaporation, plating, sputtering, or other methods after the casing substrates 31 and 32 have been laminated on the first and second major surfaces of the piezoelectric resonator 18. In fact, the terminal electrodes 33a through 33c and 34a through 34c are disposed on each of the casing substrates 31 and 32, respectively, and they may be electrically connected using conductive adhesive or conductive paste after lamination.

Also, by using a dielectric substrate for the above-mentioned casing substrates 31 and 32, capacitors are constituted between the above-mentioned terminal electrodes 33b and 34b, the electrodes 33a and 34a, and the electrodes 33c and 34c, and a capacitance-integrated piezoelectric oscillator may be constructed.

Figure 8:
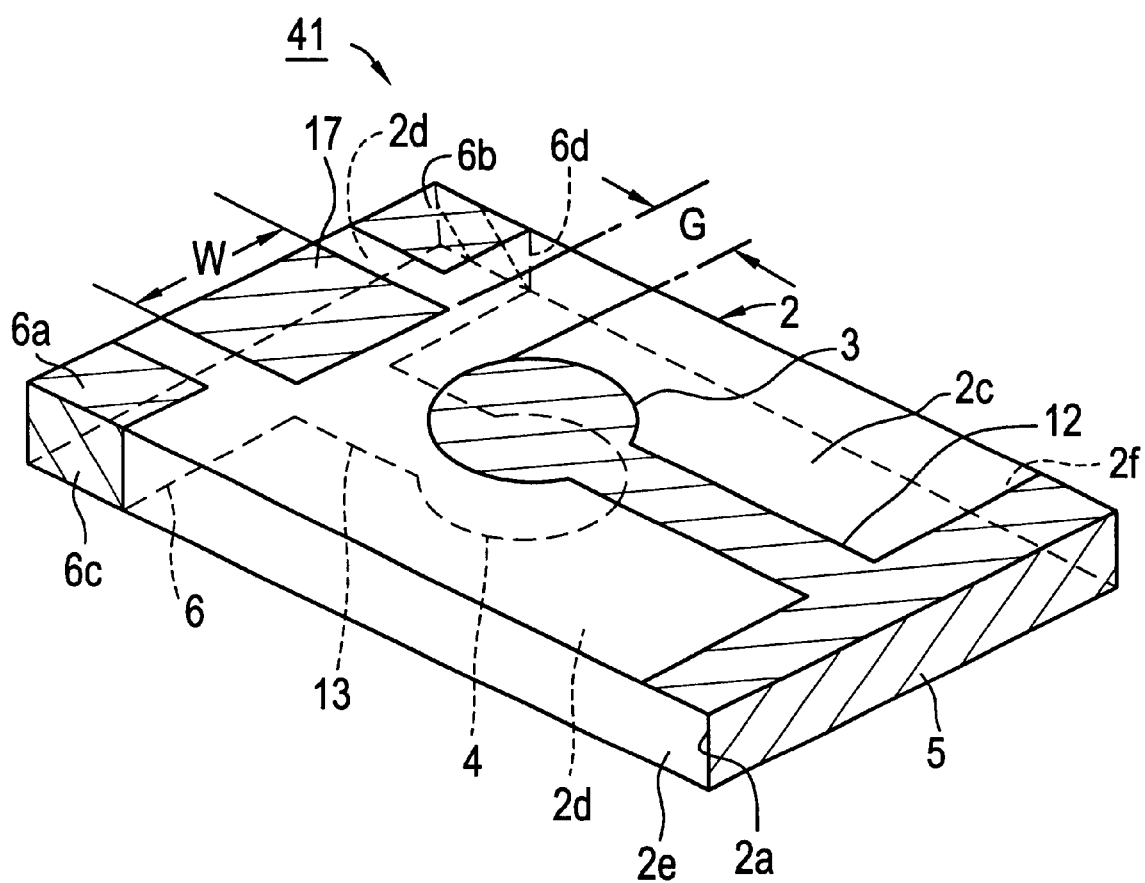
FIG. 8 is a perspective view illustrating a piezoelectric resonator relating to a fifth preferred embodiment of the present invention.

FIG. 8 is a perspective view to explain a piezoelectric resonator used in a chip-type piezoelectric resonator component according to the fifth preferred embodiment.

The piezoelectric resonator 41 is basically constructed almost in the same way as the piezoelectric resonator 18 shown in FIG. 4. That is, the vibration electrodes 3 and 4 are disposed in the approximate center of the first major surface 2c and the second major surface 2d of the piezoelectric plate 2, respectively, and the floating electrode 17 is disposed along the edge on the short side of the first major surface. In fact, in the fifth preferred embodiment, the diameter d of the above-mentioned vibration electrodes 3 and 4, the distance G between the floating electrode 17 and the vibration electrode 3, and the length W of the floating electrode 17 along the short side of the piezoelectric plate are determined so as to satisfy the following:

G/d ≦0.42

W/d ≧0.5

In addition, the fifth preferred embodiment is, in the same way as the fourth preferred embodiment, made of a chip-type piezoelectric resonator component in which casing substrates 31 and 32 are laminated on the first and second major surfaces when the ratio of G/d is set to be about 0.42 or less and the ratio of W/d is about 0.5 or more. The reasons why the fundamental wave is more effectively suppressed are explained with reference to FIG. 9 and FIG. 10 based on specific examples.

An example of the piezoelectric resonator 41 was fabricated using a piezoelectric plate having the approximate size of 3.7×3.1×0.38 mm and which was composed of ceramics (lead titanate). In this case, a plurality of piezoelectric resonators in which the diameter of the vibration electrodes was set at about 1.2 mm and the ratio G/d or W/d was variously changed were made. Regarding the piezoelectric resonators obtained in this way, the relation between the ratio of G/d and the maximum phase of the fundamental wave is shown by solid line A in FIG. 9, and the relation between the ratio W/d and the maximum phase of the fundamental wave is indicated by solid line in FIG. 10.

Figure 9:
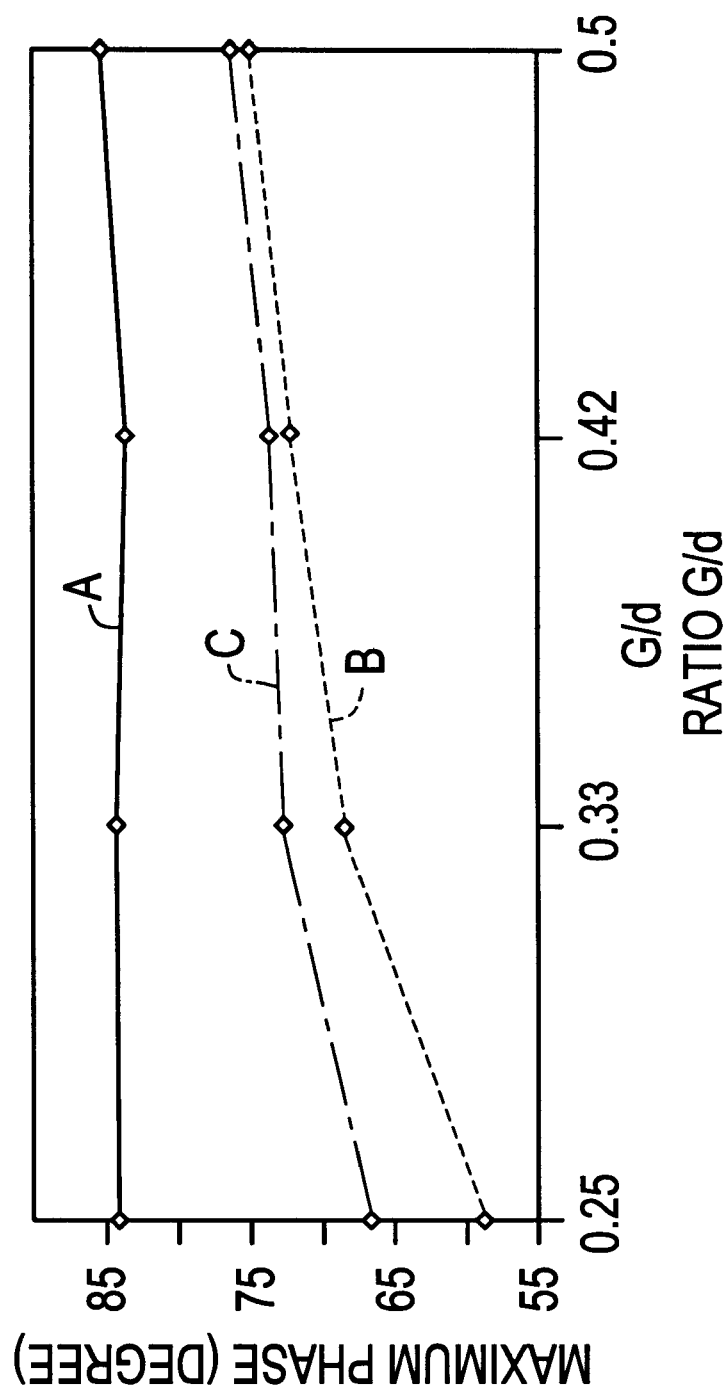
FIG. 9 shows the relation between the ratio of G/d and the maximum phase of the fundamental wave which was obtained in specific examples.
Figure 10:
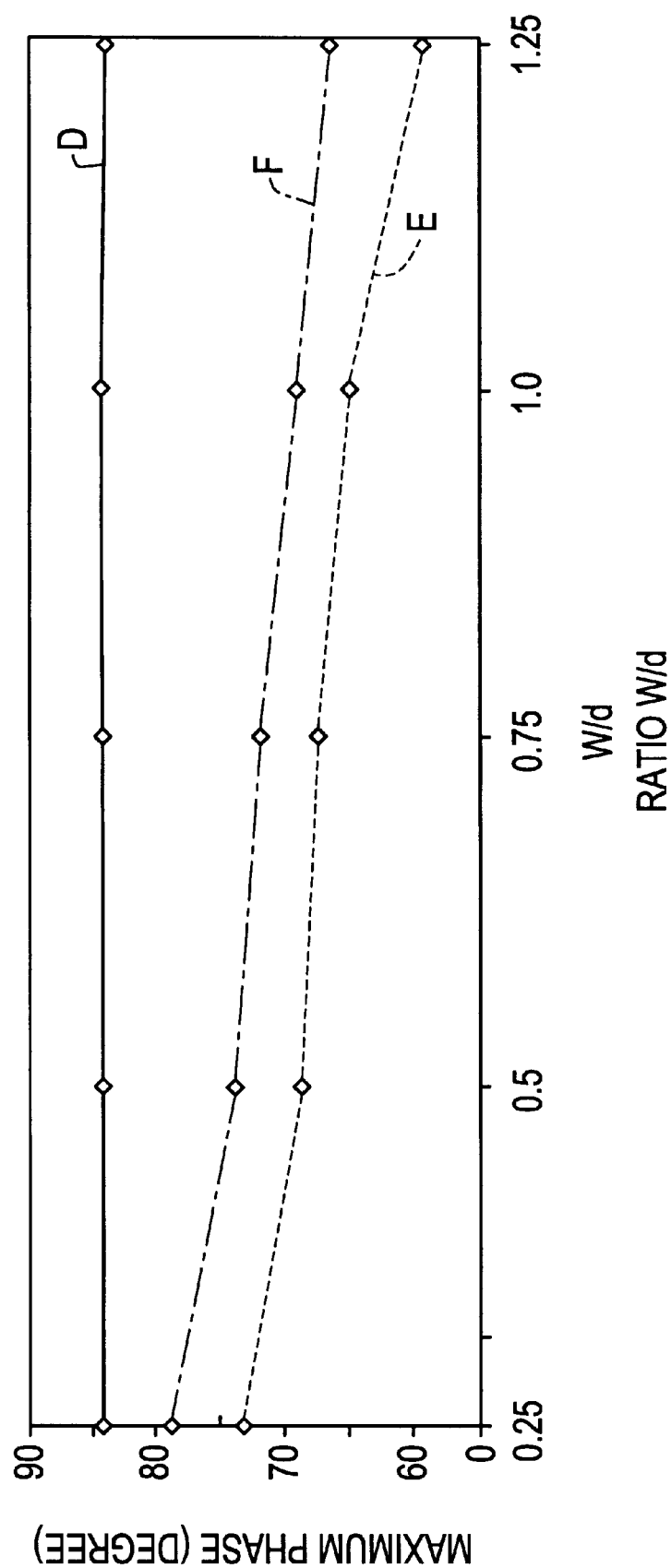
FIG. 10 shows the relation between the ratio of W/d and the maximum phase of the fundamental wave which was obtained in actual examples.

Also, the chip-type piezoelectric resonator components according to the fifth preferred embodiment were constructed using the above-mentioned piezoelectric resonators 41, and the relation between the ratio of G/d and the maximum phase of the fundamental wave and the relation between the ratio W/d and the maximum phase of the fundamental wave are shown by broken lines B and E in FIG. 9 and FIG. 10, respectively. Further, when the above-mentioned chip-type piezoelectric resonator components are constructed, as an insulating adhesive, an approximately 6 μm thick epoxy resin coating was used and the coating electrode 17 was suppressed by the insulating adhesive.

Furthermore, for comparison, except that the above-mentioned floating electrode 17 is electrically connected to the lead-out electrode 6 provided on the second major surface, the chip-type piezoelectric resonator components were composed in the same way as the chip-type piezoelectric resonator components of the preferred embodiment having the above-mentioned floating electrode 17. Regarding these examples for comparison, the relation between the ratio of G/d and the maximum phase of the fundamental wave and between the ratio W/d and the maximum phase of the fundamental wave are shown by C and F, respectively.

As clearly seen in FIG. 9 and FIG. 10, when the ratio G/d is about 0.42 or less, the chip-type piezoelectric resonator components according to the preferred embodiment using the piezoelectric resonator with the above-mentioned floating electrode 17 can provide 72 degrees or less as the maximum phase of the fundamental wave, and when the ratio W/d is about 0.5 or more, 70 degrees or less can be provided as the maximum phase of the fundamental wave.

On the contrary, in the chip-type piezoelectric resonator components constructed for comparison, it is determined that the maximum phase of the fundamental wave is significantly larger than the corresponding preferred embodiments even if either the ratio G/d and the ratio W/d is changed.

Further, in the first preferred embodiment, the fourth preferred embodiment, and the above-mentioned modifications, the floating electrode is not necessarily required to extend along the edge on the short side, and it may be arranged in the vicinity of the edge.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:
   a piezoelectric plate including a first major surface and a second major surface;
   first and second vibration electrodes partially disposed on said first major surface and said second major surface of said piezoelectric plate, respectively and arranged so as to oppose each other via said piezoelectric plate;
   first and second lead-out electrodes electrically connected to said first and said second vibration electrodes, respectively; and
   at least one floating electrode disposed along or near an edge on a short side of said piezoelectric plate on at least one of said first major surface and said second major surface of said piezoelectric plate, the floating electrode being constructed and arranged to damp a fundamental wave of a thickness extensional vibration mode; wherein
   the piezoelectric plate, the first and second vibration electrodes, the first and second lead-out electrodes and the at least one floating electrode are arranged such that the piezoelectric resonator generates a third harmonic wave of a thickness extensional vibration mode.

2. The piezoelectric resonator according to claim 1, wherein a damping layer made of resin is provided on said at least one floating electrode.

3. The piezoelectric resonator according to claim 1, wherein a casing substrate is laminated on at least one of said first major surface and said second major surface of said piezoelectric plate via an insulating adhesive so as to allow a vibrating portion including said first and said second vibration electrodes to vibrate freely and unhindered.

4. The piezoelectric resonator according to claim 1, wherein a ratio of G/d is equal to about 0.42 or less where G is a distance between said first vibration electrode and said at least one floating electrode or a distance between said second vibration electrode and said at least one floating electrode, and d is a diameter of said first vibration electrode or said second vibration electrode.

5. The piezoelectric resonator according to claim 1, wherein a ratio of W/d is about 0.5 or more where W is a length of said at least one floating electrode along the short side of said piezoelectric plate and d is a diameter of said first vibration electrode or said second vibration electrode.

6. The piezoelectric resonator according to claim 1, wherein said at least one floating electrode is a first floating electrode and is located at an edge of a first short side of said piezoelectric plate, the piezoelectric resonator further comprising a second floating electrode located at an edge of a second short side of said piezoelectric plate.

7. The piezoelectric resonator according to claim 1, wherein the at least one floating electrode is made of the same material of which the first and second vibration electrodes are made.

8. The piezoelectric resonator according to claim 1, wherein said at least one floating electrode is spaced from both longitudinal edges of said piezoelectric plate.

9. The piezoelectric resonator according to claim 8, wherein one of the first and second lead-out electrodes has two separate extension portions which are located on either side of said at least one floating electrode.

10. The piezoelectric resonator according to claim 1, wherein the first and second vibration electrodes are substantially circular.

11. A piezoelectric resonator, comprising:
    a piezoelectric plate including a first major surface and a second major surface;
    first and second vibration electrodes partially disposed on said first major surface and said second major surface of said piezoelectric plate, respectively and arranged so as to oppose each other via said piezoelectric plate;
    first and second lead-out electrodes electrically connected to said first and said second vibration electrodes, respectively; and
    at least one floating electrode disposed along or near an edge on a short side of said piezoelectric plate on at least one of said first major surface and said second major surface of said piezoelectric plate and arranged to make a fundamental wave produced in the piezoelectric plate during operation lead out of a vibrating portion of the resonator, the floating electrode being constructed and arranged to damp the fundamental wave of a thickness extensional vibration mode; wherein
    the piezoelectric plate, the first and second vibration electrodes, the first and second lead-out electrodes and the at least one floating electrode are arranged such that the piezoelectric resonator generates a third harmonic wave of a thickness extensional vibration mode.

12. The piezoelectric resonator according to claim 11, wherein a damping layer made of resin is provided on said at least one floating electrode.

13. The piezoelectric resonator according to claim 11, wherein a casing substrate is laminated on at least one of said first major surface and said second major surface of said piezoelectric plate via an insulating adhesive so as to allow a vibrating portion including said first and said second vibration electrodes to vibrate freely and unhindered.

14. The piezoelectric resonator according to claim 11, wherein a ratio of G/d is equal to about 0.42 or less where G is a distance between said first vibration electrode and said at least one floating electrode or a distance between said second vibration electrode and said at least one floating electrode, and d is a diameter of said first vibration electrode or said second vibration electrode.

15. The piezoelectric resonator according to claim 11, wherein a ratio of W/d is about 0.5 or more where W is a length of said at least one floating electrode along the short side of said piezoelectric plate and d is a diameter of said first vibration electrode or said second vibration electrode.

16. The piezoelectric resonator according to claim 11, wherein said at least one floating electrode is a first floating electrode and is disposed along or near an edge of a first short side of said piezoelectric plate, the piezoelectric resonator further comprising a second floating electrode located along or near an edge of a second short side of said piezoelectric plate.

17. The piezoelectric resonator according to claim 11, wherein the at least one floating electrode is made of the same material of which the first and second vibration electrodes are made.

18. The piezoelectric resonator according to claim 11, wherein said at least one floating electrode is spaced from both longitudinal edges of said piezoelectric plate.

19. The piezoelectric resonator according to claim 18, wherein one of the first and second lead-out electrodes has two separate extension portions which are located on either side of said at least one floating electrode.

20. The piezoelectric resonator according to claim 11, wherein the first and second vibration electrodes are substantially circular.

* * * * *